United States Patent
Lei et al.

(10) Patent No.: US 7,678,422 B2
(45) Date of Patent: *Mar. 16, 2010

(54) CYCLIC CHEMICAL VAPOR DEPOSITION OF METAL-SILICON CONTAINING FILMS

(75) Inventors: Xinjian Lei, Vista, CA (US); Hareesh Thridandam, Vista, CA (US); Manchao Xiao, San Diego, CA (US); Heather Regina Bowen, Vista, CA (US); Thomas Richard Gaffney, Carlsbad, CA (US)

(73) Assignee: Air Products and Chemicals, Inc., Allentown, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/949,868

(22) Filed: Dec. 4, 2007

(65) Prior Publication Data

US 2008/0145535 A1 Jun. 19, 2008

Related U.S. Application Data

(60) Provisional application No. 60/874,653, filed on Dec. 13, 2006.

(51) Int. Cl.
*C23C 16/18* (2006.01)
*C23C 16/30* (2006.01)

(52) U.S. Cl. .......................... 427/255.29; 427/255.31; 427/255.36; 427/255.394; 118/84; 118/88

(58) Field of Classification Search ............ 427/255.29, 427/255.31, 255.36, 255.394; 117/84, 88
See application file for complete search history.

(56) References Cited

U.S. PATENT DOCUMENTS

| | | | |
|---|---|---|---|
| 5,976,991 A | 11/1999 | Laxman et al. | |
| 6,284,646 B1* | 9/2001 | Leem | 438/629 |
| 6,403,465 B1 | 6/2002 | Liu et al. | |
| 6,426,117 B1 | 7/2002 | Yi et al. | |
| 6,440,860 B1* | 8/2002 | DeBoer et al. | 438/703 |
| 6,518,626 B1 | 2/2003 | Moore | |
| 6,559,074 B1 | 5/2003 | Chen et al. | |
| 6,677,201 B1 | 1/2004 | Bu et al. | |
| 6,869,638 B2 | 3/2005 | Baum et al. | |
| 7,005,392 B2 | 2/2006 | Baum et al. | |
| 2002/0127883 A1 | 9/2002 | Conti et al. | |
| 2003/0108674 A1* | 6/2003 | Chung et al. | 427/255.394 |
| 2003/0190423 A1 | 10/2003 | Yang et al. | |
| 2003/0190804 A1 | 10/2003 | Glenn et al. | |
| 2004/0009336 A1 | 1/2004 | Marcadal et al. | |
| 2004/0017378 A1 | 1/2004 | Lin et al. | |
| 2004/0043149 A1 | 3/2004 | Gordon et al. | |
| 2004/0043151 A1 | 3/2004 | Vaartstra | |
| 2004/0043625 A1* | 3/2004 | Vaartstra et al. | 438/758 |
| 2004/0146644 A1 | 7/2004 | Xiao et al. | |
| 2004/0197492 A1 | 10/2004 | Chen et al. | |
| 2005/0006722 A1 | 1/2005 | Zonca | |
| 2005/0032360 A1* | 2/2005 | Vaartstra | 438/648 |
| 2005/0042888 A1 | 2/2005 | Roeder et al. | |
| 2005/0255246 A1 | 11/2005 | Kim et al. | |
| 2006/0062917 A1 | 3/2006 | Muthukrishnan et al. | |
| 2006/0091492 A1* | 5/2006 | Lee et al. | 257/467 |
| 2006/0148271 A1 | 7/2006 | Borovik et al. | |
| 2006/0182885 A1* | 8/2006 | Lei et al. | 427/248.1 |
| 2006/0223337 A1 | 10/2006 | Ahn et al. | |
| 2006/0228888 A1 | 10/2006 | Lee et al. | |
| 2006/0244100 A1 | 11/2006 | Ahn et al. | |
| 2006/0245256 A1 | 11/2006 | Forbes | |
| 2006/0258173 A1* | 11/2006 | Xiao et al. | 438/780 |
| 2007/0082500 A1* | 4/2007 | Norman et al. | 438/758 |
| 2007/0259111 A1* | 11/2007 | Singh et al. | 427/248.1 |
| 2008/0299782 A9* | 12/2008 | Ramaswamy et al. | 438/785 |
| 2008/0318443 A1* | 12/2008 | Kim et al. | 438/785 |

FOREIGN PATENT DOCUMENTS

CN 1821440 A 8/2006

(Continued)

OTHER PUBLICATIONS

Min, Jae-Sik, et al, "Metal-organic atomic-layer deposition of titanium-silicon-nitride films". Applied Physics Letters, vol. 75, No. 11, Sep. 13, 1999, pp. 1521-1523.*

(Continued)

*Primary Examiner*—Bret Chen
(74) *Attorney, Agent, or Firm*—Geoffrey L. Chase

(57) ABSTRACT

A process to deposit metal silicon nitride on a substrate comprising: sorbing a metal amide on a heated substrate, purging away the unsorbed metal amide, contacting a silicon-containing source having one or more Si—H$_3$ fragments with the heated substrate to react with the sorbed metal amide, wherein the silicon-containing source has one or more H$_3$Si—NR$^0{}_2$ (R$^0$=SiH$_3$, R, R$^1$ or R$^2$, defined below) groups selected from the group consisting of one or more of:

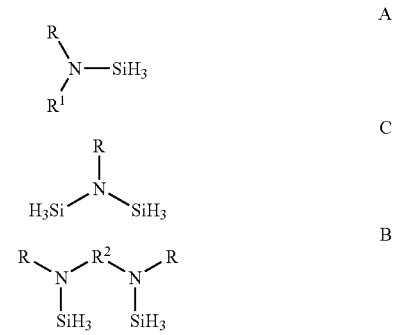

wherein R and R$^1$ in the formulas represent aliphatic groups typically having from 2 to about 10 carbon atoms, e.g., branched alkyl, cycloalkyl with R and R$^1$ in formula A also being combinable into a cyclic group, and R$^2$ representing a single bond, (CH$_2$)$_n$, a ring, or SiH$_2$, and purging away the unreacted silicon-containing source.

12 Claims, No Drawings

FOREIGN PATENT DOCUMENTS

| | | |
|---|---|---|
| EP | 1 548 839 A | 6/2005 |
| EP | 1 691 400 A | 8/2006 |
| EP | 1 724 373 A | 11/2006 |
| EP | 1 724 373 A1 | 11/2006 |
| JP | 2001230248 | 8/2001 |
| KR | 2005-0109036 A | 11/2005 |
| KR | 2006-0091240 A | 8/2006 |
| WO | 02/079211 A | 10/2002 |
| WO | 2005008196 A2 | 1/2005 |

OTHER PUBLICATIONS

Petra Alen, et al, ALD of Ta(Si) N Thin Films Using TDMAS as a Reducing . . . , J. of The Elec. Soc., 2004, 151, (8), G523-H527.

Christophe Marcadal, et al, Metallorganic Chemical Vapor Deposited TiN Barrier . . . , J. of The Elec. Soc., 2002, 149, (1), C52-C58.

Jae-Sik Min, et al, The Mechanism of Si Incorporation and the Digital Control . . . , J. of The Elec. Soc., 2000, 147, (10), pp. 3868-3872.

Ravi K. Laxman, et al, A Low-Temperature Solution for Silicon Nitride Deposition, Solid State Technology, Apr. 2000.

Xiaozhan Liu, et al, Reactions of Tetrakis(dimethylamide)-Titanium, -Zirconium and . . . , J. Am. Chem. Soc., 2001, 123, pp. 8011-8021.

John Gumpher, et al, Characterization of Low-Temperature Silicon Nitride LPCVD . . . , J. of The Elec. Soc., 2004, 151, (5), G353-G359.

P.M. Smith, et al, Chemicap Vapor Deposition of Titanium Silicon Nitride Films for Diffusion Barrier Application, 1996, Schumacher conference.

D.C. Bradley, et al, Mettalo-organic Compounds Containing Metal-Nitrogen Bonds, J. Chem. Soc., 1960, pp. 3857-3861.

Z.M. Rittersma, et al, HfSiO4 Dielectric Layers Deposited by ALD Using HfCl4 and NH2(CH2)3 Si(OC2H5)3 Precursors, J. of The Elec. Soc., 151 (11), 2004, C716-C722.

Satoshi Kamiyama, et al, Comparison Between Hf-Silicate Films Deposited by ALD with BDMAS . . . , Elec. and Solid-State Ltrs, 8 (10), 2005, F37-F39.

Kaupo Kukli, et al, Properties of Oxide Film Atomic Layer Deposited From Tetraethoxy Silane, . . . , J. of The Elec. Soc., 151, (5) 2004, F98-F104.

Yoshihide Senzaki, et al, Atomic Layer Deposition of Hafnium Oxide and Hafnium Silicate Thin . . . , J. Vac. Sci. Technol. A 22(4), Jul./Aug. 2004, pp. 1175-1181.

Won-Hee Nam, et al, Atomic Layer Deposition of Hafnium Silicate Thin Films Using HfcI2 . . . , Elec. and Solid-State Ltrs., 7 (4) 2004 C55-C56.

Won-Kyu Kim, et al, Atomic Layer Deposition of Zirconium Silicate Films Using Zirconium Tetra-tert-butoxide . . . , J. Vac. Sci. Technol. A 21 (5), Sep./Oct. 2003 L16-L18.

Won-Kyu Kim, et al, Atomic Layer Deposition of Hafnium Silicate Films Using Hafnium Tetrachloride and . . . , J. Vac. Sci. Technol. A 22 (4) Jul./Aug. 2004 pp. 1285-1289.

K.B. Chung, et al, Growth Kinetics of Atomic Layer Deposited Hf Silicate-Like Films Using . . . , Elec. and Solid-State Ltrs. 10 (1) 2007 G1-G4.

Jaehyun Kim, et al, Atomic Layer Chemical Vapor Deposition and Electrical Characterization of Hafnium . . . J. of The Elec. Soc. 152 (4) 2005 F45-F48.

Anthony C. Jones, et al, Some Recent Developments in the MOCVD and ALD of High-k Dielectric Oxides, J. Mater. Chem. 2004 14 pp. 3101-3112.

Satoshi Kamiyama, et al, Atomic Layer Deposition of Hafnium Silicate Gate Dielectric Films Using . . . , Elec. and Solid-State Ltrs. 8 (8) 2005 G215-G217.

Yoshihide Senzaki, et al, Atomic Layer Deposition of High-k Metal Oxides for Gate and Capacitor Dielectrics, Elec. Soc. Proceedings vol. 2003-14 pp. 423-428.

Kazuhiko Endo, et al, Metal Organic Atomic Layer Deposition of Metal Silicate Film for High-k Gate Dielectrics, Jap. Soc. of App. Physics, Jap. J. of Appl. Physics, vol. 43, No. 10A, 2004, pp. L1296-L1298.

\* cited by examiner

CYCLIC CHEMICAL VAPOR DEPOSITION OF METAL-SILICON CONTAINING FILMS

CROSS REFERENCE TO RELATED APPLICATIONS

This patent application claims the benefit of US Provisional Patent Application No. 60/874,653 filed Dec. 13, 2006.

BACKGROUND OF THE INVENTION

Metal silicon nitride films have potential use as diffusion barrier for copper interconnect or as gate electrodes or as heater for phase change memories. Currently, metal amide, silane, and ammonia have been investigated for making metal silicon nitride. Silane is a pyrophic gas, implying a potential hazard.

BRIEF SUMMARY OF THE INVENTION

The present invention is a process to deposit metal silicon nitride on a heated substrate comprising:
a. contacting a heated substrate with a metal amide to sorb the metal amide on the heated substrate,
b. purging away any unsorbed metal amide,
c. contacting the heated substrate with a silicon-containing source having one or more Si—$H_3$ fragments to react with the sorbed metal amide, wherein the silicon-containing source has one or more $H_3Si$—$NR^0{}_2$ ($R^0$=$SiH_3$, R, $R^1$ or $R^2$, defined below) groups selected from the group consisting of one or more of:

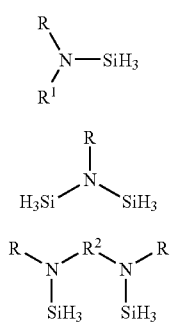

wherein R and $R^1$ in the formulas represent aliphatic groups typically having from 3 to about 10 carbon atoms, e.g., branched alkyl, cycloalkyl with R and $R^1$ in formula A also being combinable into a cyclic group, and $R^2$ representing a single bond, $(CH_2)_n$, a ring, or $SiH_2$, and
d. purging away the unreacted silicon-containing source.

Several advantages can be achieved through the practice of this invention, and some of advantages are as follows:
- an ability to produce high quality ternary metal silicon nitride films;
- an ability to form high quality films while eliminating some of the common precursors that present significant safety and corrosion issues;
- an ability to incorporate desirable silicon levels in TiN at temperatures generally below conventional processes, e.g., below 500° C.;
- an ability to control the silicon content in the metal silicon nitride via the control of pulse time of a silicon source in a cyclic deposition process, e.g., a CVD process;
- an ability to achieve excellent deposition rates in a cyclic CVD, thus making possible an increase of wafer throughput at production scale;
- an ability to produce metal silicon nitride films using two precursors while eliminating the use of a separate nitrogen source, e.g., ammonia;
- an ability to reduce the metal center in a resulting metal silicon, thus reducing the resisitivity of the resulting film;
- an ability to tune the physical properties of the resulting films such as resistivity.

DETAILED DESCRIPTION OF THE INVENTION

This invention is related to a process to make ternary metal-silicon containing films using cyclic chemical vapor deposition or atomic layer deposition techniques. This invention is related to an improvement in a process to produce ternary metal silicon nitride films via cyclic deposition. Sequential deposition of select precursors via chemical vapor deposition and atomic layer deposition techniques provide for excellent quality films and reduces the associated hazards associated with many precursor formulations.

The term "cyclical deposition" as used herein refers to the sequential introduction of precursors (reactants) to deposit a thin layer over a substrate structure and includes processing techniques such as atomic layer deposition and rapid sequential chemical vapor deposition. The sequential introduction of reactants results in the deposition of a plurality of thin layers on a substrate and the process is repeated as necessary to form a film layer having a desired thickness.

Atomic layer deposition ("ALD") is one form of cyclic deposition and comprises the sequential introduction of pulses of a first precursor and, in this case, a second precursor. In many of the prior art procedures, pulses of a third precursor were employed. For example, in an ALD process, there is the sequential introduction of a pulse of a first precursor, followed by a pulse of a purge gas and/or a pump evacuation, followed by a pulse of a second precursor, which is followed by a pulse of a purge gas and/or a pump evacuation. If necessary, or desired, there may be a pulse of a third precursor. Sequential introduction of separate pulses results in alternating self-limiting chemisorption of monolayers of each precursor on the surface of the substrate and forms a monolayer of the deposited materials for each cycle. The cycle may be repeated as necessary to generate a film of desired thickness.

The growth rate of ALD is very low compared to conventional CVD process. A typical growth rate of an ALD process is 1-2 Å/cycle. One approach to increase of growth rate is that of modification of the ALD process by operating at a higher substrate temperature than ALD, leading to a chemical vapor deposition ("CVD")-like process, but still taking advantage of the sequential introduction of precursors. This process is called cyclic CVD.

Cyclic CVD deposition may also be used as a method forming ternary films of desired composition and thickness. In this process the precursors (reactants) are introduced to the CVD chamber and vaporized onto a substrate. Subsequent reactants are supplied as in an ALD process but, of course, the individual film thicknesses in the cyclic CVD process are not limited to monolayers.

To facilitate an understanding of a cyclic deposition process for the formation of a ternary film as contemplated herein, a first precursor for deposition onto a substrate is a metal amide. Metals commonly used in semiconductor fabrication include and suited as the metal component for the metal amide include: titanium, tantalum, tungsten, hafnium, zirconium and the like.

Specific examples of metal amides suited for use in the cyclic process include those metal amides selected from the group consisting of tetrakis(dimethylamino)titanium (TD-MAT), tetrakis(diethylamino)titanium (TDEAT), tetrakis(ethylmethylamino)titanium (TEMAT), tetrakis(dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), tetrakis(ethylmethylamino)hafnium (TEMAH), tert-butylimino tris(diethylamino)tantalum (TBTDET), tert-butylimino tris(dimethylamino)tantalum (TBTDMT), tert-butylimino tris(ethylmethylamino)tantalum (TBTEMT), ethylimino tris(diethylamino)tantalum (EITDET), ethylimino tris(dimethylamino)tantalum (EITDMT), ethylimino tris(ethylmethylamino)tantalum (EITEMT), tert-amylimino tris(dimethylamino)tantalum (TAIMAT), tert-amylimino tris(diethylamino)tantalum, pentakis(dimethylamino)tantalum, tert-amylimino tris(ethylmethylamino)tantalum, bis(tert-butylimino)bis(dimethylamino)tungsten (BTBMW), bis(tert-butylimino)bis(diethylamino)tungsten, bis(tert-butylimino)bis(ethylmethylamino)tungsten, and mixtures thereof.

The metal amide is supplied to the deposition chamber at a predetermined molar volume and for a predetermined time. Typically, the metal amide is supplied to a CVD or ALD chamber for a period of 0.1 to 80 seconds to allow the material to be sufficiently adsorbed so as to saturate a surface. During deposition the metal amide preferably is in the gas phase and supplied in a predetermined molar volume typically in the range of 1 to 100 micromoles. Deposition temperatures are conventional and range from about 200 to 500° C., preferably from 200 to 350° C. Pressures of from 50 mtorr to 100 torr are exemplary.

In a second step of the process, and subsequent to the introduction of the metal amide, an inert gas, such as Ar, $N_2$, or He, is used to sweep unreacted metal amide from the chamber. Typically in a cyclic deposition process, a gas, such as Ar, $N_2$, or He, is supplied into the chamber at a flow rate of 50 to 2000 sccm, thereby purging the metal amide and any byproducts that remain in the chamber.

The silicon-containing sources have one or more Si—$NR^0{}_2$ ($R^0$=$SiH_3$, R, $R^1$ or $R^2$, defined below) groups with structures shown as below:

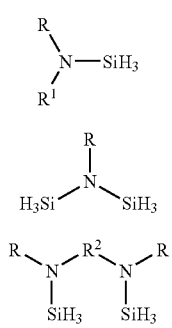

wherein R and $R^1$ in the formulas represent aliphatic groups typically having from 3 to about 10 carbon atoms, e.g., branched alkyl, cycloalkyl with R and $R^1$ in formula A also being combinable into a cyclic group, and $R^2$ representing a single bond, $(CH_2)_n$, a ring, or $SiH_2$. It is well known that metal amides react with compound having Si—H fragment. Thus, interaction of the metal amides and the silicon sources with each other must be avoided in the gas phase. The process revealed hereby consists of a typical cycle as follows, expose the metal amide to a heated substrate loaded in a reaction chamber allowing the metal amide to sorb or react with the surface of the substrate, purge away the unsorbed or unreacted metal amide, introduce silicon-containing sources having one or more Si—$NH_3$ groups into the reaction chamber which reacts with the reacted or sorbed metal amide, purge away the unreacted monoalkylaminosilane, if need, introduce ammonia into the reaction chamber, purge away the unreacted ammonia. The cycle can be repeated untile a desired film thickness is reached.

Examples of silicon-containing sources having one or more Si—$H_3$ fragments suited for use in the process include di-iso-propylaminosilane(DIPAS), di-tert-butylaminosilane (DTBAS), di-sec-butylaminosilane, di-tert-pentylamino silane.

The second precursor comprised of the silicon source sources having one or more Si—$H_3$ fragments is introduced into the chamber at a predetermined molar volume. e.g., from 1 to 100 micromoles for a predetermined time period, preferably about 0.1 to 100 seconds. The silicon precursor reacts with the metal amide and is adsorbed onto the surface of the substrate resulting in the formation of silicon nitride via metal-nitrogen-silicon linkage. Conventional deposition temperatures of from 200 to 500° C. and pressures of from 50 mtorr to 100 torr are employed.

Subsequent to the introduction of the silicon source, a gas, such as Ar, $N_2$, or He, is introduced into the chamber typically at a flow rate of 50 to 2000 sccm in order to purge the unreacted silicon source and byproducts from the deposition chamber. Sometimes, in order to purge the unreacted or byproducts, the purge gas may be continuously introduced during the entire deposition cycle.

Optionally, a third precursor that may be employed in the cyclic deposition process, particularly an ALD process which may require a nitrogen source such as ammonia or hydrazine These gases are used in order to produce nitrogen-rich film and further reduce the carbon content incorporated in the films in the aforementioned steps.

In carrying out the process, a suggested deposition cycle is as follows:

1. expose vapors of a metal amide to a heated substrate loaded in a reaction or deposition chamber;
2. allow the metal amide to react with the surface of the substrate,
3. purge away the unreacted metal amide;
4. contact a silicon-containing source having one or more Si—$H_3$ fragments with the resulting substrate;
5. purge away the unreacted silicon-containing source;
6. if desired, introduce a nitrogen containing reactant, such as ammonia, into the reaction chamber,
7. purge away the unreacted nitrogen containing reactant; and,
8. repeat the cycle as outlined above and until a desired film thickness is reached.

It is possible in the above cycle to reverse the order of precursor reactants introduced to the chamber, e.g., the silicon source may be introduced first followed by addition of the metal amide. However, higher deposition temperatures are generally required when the silicon source is deposited first. As stated, the metal amide generally deposits at lower temperatures than the silicon source and, further, catalytically facilitates its deposition at lower temperature.

Example 1

Deposition of TiSiN Films From TDMAT and DIPAS at 350° C.

The cyclic chemical vapor deposition was conducted in an ALD reactor similar to what described in the literature (Becker, J. S., S. Suh and R. G. Gordon, *Chem. Mater.* 15, 2969-2976 (2003)). Di-isopropylaminosilane (DIPAS) was placed in a stainless steel container and heated to 50° C., at which temperature the vapor pressure of DIPAS is about 85 torr. Tetrakis(dimethylamido)titanium (TDMAT) was placed within a separate stainless steel container and heated to 50° C., at which temperature the vapor pressure of TDMAT is about 0.6 torr. Nitrogen was supplied at 15 psig to mass flow meters. Silicon substrates were prepared by breaking six-inch silicon wafers into one-inch squares. Five of the silicon substrates were from 20 ohm-cm wafers and 2 were 1-25 ohm-cm with 1000 Å thermal oxide. The seven wafer substrates were then placed onto a half round substrate holder with dimension of 11 inches long by 1.5 inches across. A carbon disc with a diameter of about 1 cm was placed on top of one of the substrates. The substrate holder was then inserted into the chamber having dimension of 26 inches long and 1 and ¾ inches in diameter contained within a tube-furnace. The chamber was heated to a temperature of 350° C.

The ALD chamber was initially pumped to below 10 militorr, the deposition cycle was begun by evacuating the chamber with the throttle valve opened and a fixed volume of about 10 cc was pressurized with DIPAS from the stainless steel container for 2 seconds. A fixed volume valve was then closed to the head space of the DIPAS container. A throttle valve) was closed and valve was opened, allowing the DIPAS vapor to be introduced into chamber. After 2 seconds an exit valve of the fixed volume was closed, the throttle valve was opened and nitrogen was introduced via mass flow controllers to purge away any residual DIPAS in the reaction chamber and connecting lines for 15 seconds. The nitrogen purges were stopped, and the system was evacuated 2 seconds. The throttle valve was then closed and TDMAT was allowed to flow from the head space of the stainless steel container for 3 seconds. Then valves to headspace of the TDMAT container were closed, the throttle valve was opened and nitrogen was introduced via mass flow controllers to purge the chamber and connecting lines for 15 seconds.

After repeating these cycles 1000 times, the reactor chamber was cooled down to room temperature under nitrogen atmosphere and then the wafer pieces were removed from the chamber. The resulting films were examined by resistivity measurements, indicating they are conductive films. The film composition was analyzed by energy-dispersive X-ray spectroscopy (EDX) and Rutherford Backscattering Spectrometry (RBS) which indicate the films consist of titanium, silicon, oxygen, nitrogen, and carbon.

Example 2

Deposition of TiSiN Films From TDMAT and DIPAS at 350° C.

The cyclic chemical vapor deposition processes with 500 cycle times was also conducted in accordance with the other process steps of Example 1. The deposition rates range from 2 to 3 Å/cycle depending on the positions of wafer pieces.

Example 3

Deposition of TiSiN Films From TDMAT and DIPAS at 350° C.

The cyclic chemical vapor deposition processes with 1500 cycle times was also conducted in accordance with the other process steps of Example 1. The deposition rates range from 2 to 3 Å/cycle depending on the positions of wafer pieces.

Example 4

Deposition of TiSiN Films From TDMAT and DIPAS at 325° C.

Example 1 was repeated with substrate temperature at 325° C. The deposition rates range from 0.4 to 0.7 Å/cycle depending on the positions of wafer pieces

Example 3

Deposition of TiSiN Films From TDMAT and DIPAS at 250° C.

Example 1 was repeated with substrate temperature at 250° C. and visually there is almost no deposition.

What is claimed is:

1. A process to deposit metal silicon nitride on a substrate without the requirement of a separate nitrogen source comprising:
   a. contacting a heated substrate with a metal amide to sorb the metal amide on the heated substrate, wherein the metal amide is selected from the group consisting of tetrakis(dimethylamino)titanium (TDMAT), tetrakis(diethylamino)titanium (TDEAT), tetrakis(ethylmethylamino)titanium (TEMAT), tetrakis(dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), tetrakis(ethylmethylamino)hafnium (TEMAH), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, bis(tert-butylimino)bis(dimethylamino)tungsten (BTBMW), bis(tert-butylimino)bis(diethylamino)tungsten, bis(tert-butylimino)bis(ethylmethylamino)tungsten, and mixtures thereof;
   b. purging away any unsorbed metal amide,
   c. contacting the heated substrate with a silicon-containing source having one or more Si—$H_3$ fragments and a Si—$NR_2$ group to react with sorbed metal amide on the substrate to form a metal silicon nitride, wherein the silicon-containing source is selected from the group consisting of di-iso-propylaminosilane(DIPAS), di-tert butylaminosilane (DTBAS), di-sec-butylaminosilane, di-tert-pentylamino silane and mixtures thereof, and
   d. purging away the unreacted silicon-containing source.

2. The process of claim 1 wherein the cycle can be repeated until a desired thickness of film is established.

3. The process of claim 1 wherein the metal silicon nitride is titanium silicon nitride.

4. The process of claim 3 wherein the metal amide is selected from the group consisting of tetrakis(dimethylamino)titanium (TDMAT), tetrakis(diethylamino)titanium (TDEAT), tetrakis(ethylmethylamino)titanium (TEMAT) and mixtures thereof.

5. The process of claim 4 wherein the silicon-containing source having one or more Si—H$_3$ fragments is di-iso-propylaminosilane(DIPAS).

6. The process of claim 1 where the metal silicon nitride is tantalum silicon nitride.

7. The process of claim 6 wherein the metal amide is selected from the group consisting of tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, and mixtures thereof.

8. The process of claim 1 where the metal silicon nitride is tungsten silicon nitride.

9. The process of claim 8 wherein the metal amide is selected from the group consisting of bis(tert-butylimino)bis(dimethylamino)tungsten (BTBMW), bis(tert-butylimino)bis(diethylamino)tungsten, bis(tert-butylimino)bis(ethylmethylamino)tungsten, and mixtures thereof.

10. A process to deposit metal silicon nitride on a substrate without the requirement of a separate nitrogen source comprising:
  a. contacting vapors of a metal amide comprising tetrakis(dimethylamino)titanium (TDMAT) with a heated substrate long enough to allow the surface sorption to reach its self-limiting end,
  b. purging away the unsorbed metal amide,
  c. contacting a silicon-containing source comprising di-iso-propylaminosilane(DIPAS) with the heated substrate to react with the sorbed metal amide, wherein the exposure duration long enough to allow the surface reaction to reach its self-limiting end, and
  d. purging away the unreacted silicon-containing source.

11. The process of claim 10 further comprising the step of
  e. introducing vapors of a nitrogen-containing compound, and
  f. purging away the unreacted nitrogen-containing gas, and repeating steps a through f. until a desired thickness of film is established.

12. The process of claim 11 wherein the nitrogen-containing compound is selected from the group consisting of ammonia, hydrazine, monoalkylhydrazine, dialkylhydrazine, and mixture thereof.

* * * * *